(12) United States Patent
Wheatley

(10) Patent No.: US 6,278,351 B1
(45) Date of Patent: Aug. 21, 2001

(54) MULTI-COIL MRI MAGNET

(75) Inventor: Roger W. Wheatley, Niskayuna, NY (US)

(73) Assignee: Transurgical, Inc., Setauket, NY (US)

( * ) Notice: Subject to any disclaimer, the term of this patent is extended or adjusted under 35 U.S.C. 154(b) by 0 days.

(21) Appl. No.: 09/478,454

(22) Filed: Jan. 6, 2000

Related U.S. Application Data

(60) Provisional application No. 60/115,367, filed on Jan. 11, 1999.

(51) Int. Cl.[7] ................................. H01F 5/00; G01V 3/00
(52) U.S. Cl. ........................ 335/299; 335/216; 335/301; 324/319; 324/320
(58) Field of Search .................... 335/216, 296–299, 335/301; 324/318–320

(56) References Cited

U.S. PATENT DOCUMENTS

| 4,701,736 | 10/1987 | McDougall et al. | 335/299 |
| 4,985,679 * | 1/1991 | McDougall | 324/318 |
| 5,008,624 * | 4/1991 | Yoshida | 324/318 |
| 5,525,949 * | 6/1996 | Hanley et al. | 335/216 |

FOREIGN PATENT DOCUMENTS

WO 98/52465   11/1998   (WO).

* cited by examiner

*Primary Examiner*—Raymon M. Barrera
(74) *Attorney, Agent, or Firm*—Lerner, David, Littenberg, Krumholz & Mentlik, LLP

(57) ABSTRACT

A single-sided magnet for magnetic resonance imaging has a main field assembly including numerous small outer field coils arrayed around a main axis. The main field assembly may also include a central field coil coaxial with the main axis inside the array of outer field coils, as well as shim coils, also coaxial with the main axis.

16 Claims, 2 Drawing Sheets

MULTI-COIL MRI MAGNET

CROSS REFERENCE TO RELATED APPLICATIONS

The present application claims benefit of United States Provisional Patent Application No. 60/115,367, filed Jan. 11, 1999, the disclosure of which is hereby incorporated by reference herein.

FIELD OF THE INVENTION

The present invention relates to magnetic resonance imaging apparatus and methods.

BACKGROUND OF THE INTENTION

Magnetic resonance is used in medical imaging for diagnostic purposes. In magnetic resonance imaging procedures, the region of the subject to be imaged is subjected to a strong magnetic field. Radio frequency signals are applied to the tissues of the subject within the imaging volume. Under these conditions, atomic nuclei are excited by the applied radio frequency signals and emit faint radio frequency signals, referred to herein as magnetic resonance signals. By applying appropriate gradients in the magnetic field during the procedure, the magnetic resonance signals can be obtained selectively from a limited region such as a two-dimensional slice of the subject's tissue. The frequency and phase of the signals from different portions of the slice can be made to vary with position in the slice. Using known techniques, it is possible to deconvolute the signals arising from different portions of the slice and to deduce certain properties of the tissues at each point within the slice from the signals.

Magnetic resonance imaging instruments of the types commonly used for medical diagnostic applications include large, precise magnets which are arranged to impose a high magnetic field, typically about one Tesla or more over a relatively large imaging volume typically 10 cm or more in diameter. Certain magnetic resonance imaging static field magnets severely limit access to the subject. For example, a solenoidal air-core superconducting magnet may have superconductive coils surrounding a tubular subject-receiving space. The subject lies on a bed which is advanced into the said tubular space so that the portion of the patient to be imaged is disposed inside of the tubular space. Iron core magnets typically have ferromagnetic frames defining opposed poles and a subject-receiving space lying between the poles. Permanent magnets or electromagnets are associated with the frame for providing the required magnetic flux. Depending upon the design of the magnet, either the superconductive coils or the frame may obstruct access to the patient during operation of the magnetic resonance instrument. Moreover, because the magnetic resonance imaging instruments typically employed in medicine are expensive, fixed structures, there are substantial costs associated with occupancy of the instrument.

Copending, commonly assigned U.S. patent application Ser. No. 09/083,414, filed May 22, 1998, and the corresponding International Application PCT/US98/10623 and International Publication WO 98/52465, the disclosures of which are hereby incorporated by reference herein, describe apparatus which incorporates magnetic resonance imaging capability in a relatively small device. Apparatus according to preferred embodiments disclosed in these applications includes a movable static field magnet adapted to apply a static magnetic field in a magnetic resonance volume at a predetermined disposition relative to the static field magnet, and may also include an energy applicator such as a high intensity focused ultrasound or "HIFU" device. The preferred apparatus according to the copending applications also includes positioning means for moving the static field magnet and the energy applicator to position the magnet and the applicator so that the magnetic resonance volume at least partially encompasses a region of the subject to be treated and so that the energy applicator is focused within the magnetic resonance volume. For example, the apparatus may include a chassis carrying both the static field magnet and the energy applicator, and the positioning means is arranged to move the chassis relative to the subject. The apparatus may further include ancillary equipment such as gradient coils mounted to the chassis or otherwise secured in position relative to the static field magnet for applying a magnetic field gradient within the magnetic resonance volume, as well as radio frequency equipment for applying radio frequency signals to the subject and receiving the resulting magnetic resonance signals. Apparatus of this type may be used to acquire images of small regions within the patient's body, and may also be used to perform therapeutic procedures such as thermal ablation of tumors or other undesired tissues. The therapeutic procedures can be monitored using the magnetic resonance apparatus.

As disclosed in the copending applications, the static field magnet desirably is a "single-sided" static field magnet. That is, the magnet is arranged so that the magnetic resonance volume where the field is suitable for imaging is disposed outside of the static field magnet and spaced from the static field magnet in a forward direction. Thus, the magnet can be placed alongside the patient, without placing the patient into the magnet. The static field magnet most preferably is substantially smaller than the static field magnets utilized in conventional magnetic resonance imaging instruments. For example, the static field magnet may have dimensions of a meter or less and may be light enough to be moved readily by a positioning device of reasonable cost and proportions. Thus, the entire apparatus can be moved as required to position it adjacent to the region of the subject's body which requires treatment. The most preferred apparatus according to these embodiments is small enough and inexpensive enough to be used in a clinical setting such as a physician's office or medical center. Thus, it is feasible to perform magnetic resonance-monitored energy applying procedures in a normal clinical setting. There is no need to occupy an expensive diagnostic magnetic resonance imaging instrument during such procedures.

The copending applications disclose improved single-sided static-field magnets for magnetic resonance. For example, the static field magnet may include a set of concentric superconducting coils mounted in a cryostat. The dimensions of the coils, as well as the current flows in the coils, are selected to provide a relatively small linear field gradient $$\frac{dB}{dZ},$$

i.e., a relatively small, linear variation of field magnitude B with distance in the axial or Z direction of the coils, within a region spaced forwardly from the coils in the axial direction. In this same region, the radial field curvature $$\frac{d^2B}{dX^2}$$

is also relatively small and hence the field gradient in radial or X directions transverse to the axial direction of the coils is also relatively small. For example, the magnet may provide a field with a linear axial gradient and with very small radial gradients over a region having an axial extent of about 1 cm and having a diameter of about 3 cm, this region being centered on a central point about 20–30 cm forward of the coils. The magnet may be used to acquire images within this region. Because the static field magnet imposes a field gradient in the axial or Z direction, the magnetic resonance frequencies of nuclei vary with location in the axial or Z direction. Different two-dimensional sections or "slices" can be selected by tuning the RF apparatus to the magnetic resonance frequency associated with each axial location.

Another magnet for MRI imaging which uses a set of coils concentric with a central axis to generate a static field having a region suitable for imaging surrounding the central axis is shown in U.S. Pat. No. 4,701,736.

Although the concentric coil designs can provide useful magnetic fields for imaging, further improvements would desirable. Typically, the large, unitary coils used in concentric coil designs are superconducting coils. Large superconducting coils are expensive to fabricate. It would be desirable to provide a magnet design which can generate a field equal to or better than the field obtained with concentric coils, but which does not require large, unitary superconducting coils.

SUMMARY OF THE INVENTION

One aspect of the present invention provides a single-sided magnet for magnetic resonance imaging. A magnet in accordance with this aspect of the invention includes a plurality of field coils. Each of these field coils has a coil axis and turns extending around the coil axis. The field coils are arranged in a substantially symmetrical pattern about a main axis, with the coil axes of the individual field coils being disposed substantially parallel to the main axis. Typically, the field coils are substantially identical to one another and are disposed in a generally planar array, the plane of the array being perpendicular to the main axis. The field coils may be in the form of right circular cylinders and are arranged with coil axes intercepting a circular locus coaxial with the main axis. The magnet preferably includes more than 4 of the field coils and desirably includes about 6 to about 12 field coils. For example, each of the field coils may be in the form of a right circular cylinder having an outer radius of about 10 cm or less and a length of about 15 cm or less and the circular locus may have a radius of about 20 cm to about 40 cm. Preferably, the field coils are superconducting coils. The magnet may further include a unitary cryostat encompassing all of the field coils as, for example, a toroidal cryostat.

Further aspects of the invention include methods of operating such magnets by actuating the field coils with current so that the currents flow around the axes of the field coils. Vost preferably, the currents flow around the axis of all of the field coils in the same sense, i.e., all counterclockwise or all clockwise around the field coil axes. Desirably, each of the field coils carries an equal number of ampere-turns. The fields generated by the field coils cooperatively constitute a main field which has a imaging region surrounding the main axis at a location forward of the field coils. That is, the location of the imaging region on the main axis is remote from the plane of the field coils in a forward direction along the axis. In the imaging region, the main field has a non-zero magnitude and a small gradient in the axial direction. The main field also has a relatively low radial curvature in the imaging region. At a "sweet spot", the radial field curvature is at a minimum. Desirably, at the sweet spot, the radial field curvature is such that the difference in the field over a 4 cm radius from axis 14 amounts to less than about 1000 parts per million, and preferably less than about 500 parts per million. The magnitude of the field at the sweet spot desirably is at least about 500 gauss and more preferably at least about 1 kilogauss. The axial field gradient desirably is less than about 5 g/cm. With the preferred magnets, the main field is essentially constant along any circular locus concentric with the main axis near the sweet spot. The ability to achieve a substantially uniform field at all points around the main axis is surprising inasmuch as the field is generated by discrete coils disposed at spaced-apart locations around the main axis.

The magnet in accordance with the present invention may further include a plurality of shim coils. The shim coils may be resistive coils concentric with the main axis and disposed at or near the plane of the field coil array.

Because the radial field curvature is at a minimum at the sweet spot, a slice or surface of constant field magnitude is close to a plane perpendicular to the main axis. However, at other locations within the imaging region, the slice or surface of constant field magnitude is in the form of a bowl-shape having an axis coincident with the main axis. Displaying the image of such a slice as a planar image, or treating the magnetic resonance data from such a slice as data defining a planar slice introduces some inaccuracy into the system. The degree of deviation from a plane varies with the axial location of the slice. The shim coils apply an additional field, referred to here as the "shim field". The shim field can be adjusted so as to move the sweet spot along the main axis to a location along the axis different from the axial location of the sweet spot of the main field alone. In the same manner as described in the copending, commonly assigned U.S. patent application Ser. No. 09/206,443 of Mark Wagshul entitled "Magnetic Resonance Apparatus and Methods with Shim Adjustment" filed on or about Dec. 7, 1998, the disclosure of which is incorporated by reference herein, a magnet with an adjustable sweet spot can be used in conjunction with radio frequency ("RF") excitation apparatus and a receiving apparatus to elicit magnetic resonance signals from a subject. In the conventional manner, the RF excitation and receiving apparatus is tuned to a frequency corresponding to the magnetic field prevailing in a particular slice. Operation of the shim coils is coordinated with tuning of the RF apparatus so that the sweet spot is aligned with the selected slice. Stated another way, when a particular slice is selected by the RF apparatus, the shim field is adjusted so that the resultant field has its sweet spot at the selected slice.

DETAILED DESCRIPTION OF THE PREFERRED EMBODIMENTS

Figure 1:
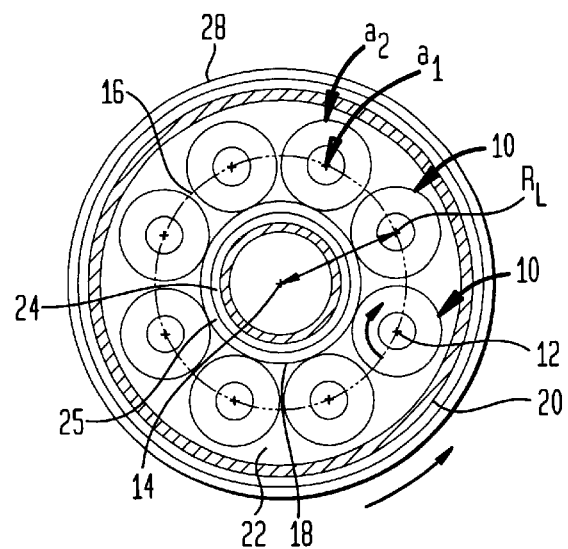
FIG. 1 is a diagrammatic sectional view depicting a magnet in accordance with one embodiment of the invention.
Figure 2:
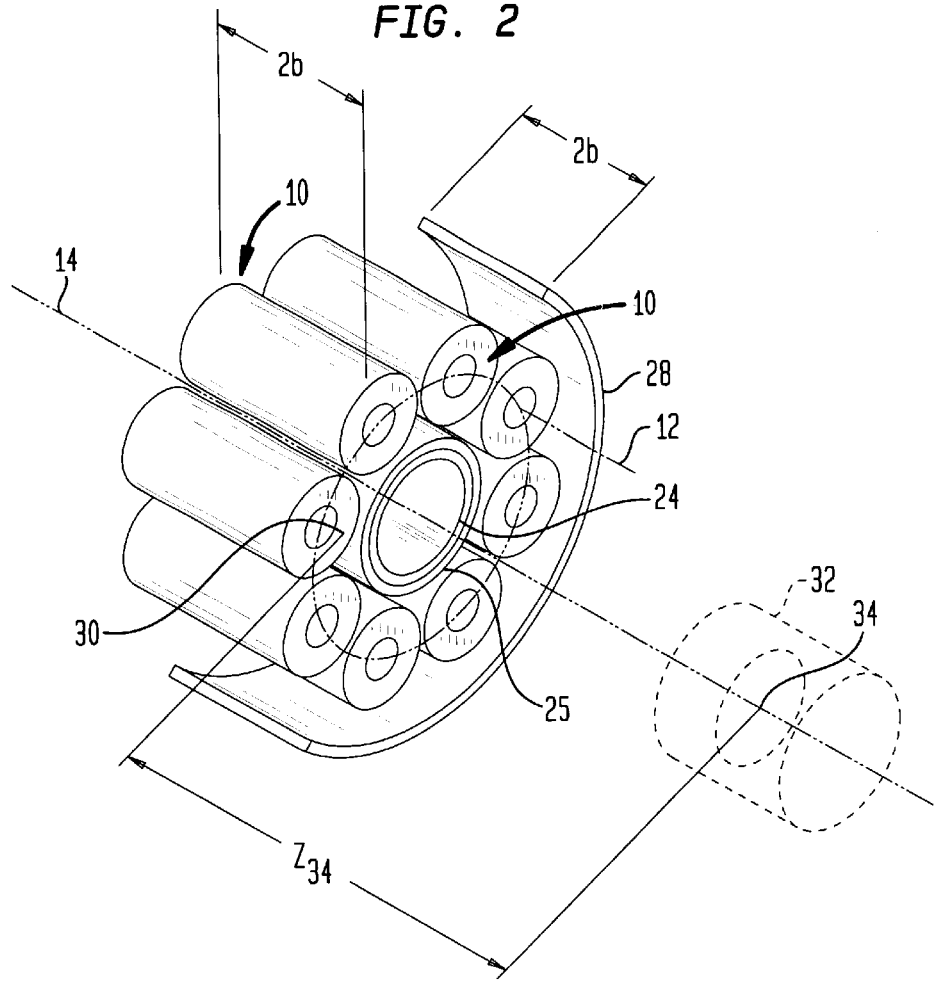
FIG. 2 is a diagrammatic perspective view of the magnet shown in FIG. 1.

A magnet in accordance with one embodiment of the invention includes eight outer field coils 10. Each field coil 10 is in the form of a cylindrical solenoid having a field coil axis 12. Thus, each field coil 10 may include one or more helical windings formed from a superconducting material coaxial with field coil axis 12. All of the windings are arranged and connected so that current passing through the windings passes around the field coil axis 12 in the same sense, i.e., counterclockwise around axis 12 as seen in FIG. 1. Each field coil has an inner radius $a_1$ and an outer radius $a_2$. Desirably, $a_2$ is about 15 cm or less, more preferably between about 5 and about 10 cm and most preferably about 8 cm. The inner radius $a_1$ desirably is about 2 to about 5 cm and most preferably about 4 cm. Each field coil has an axial length $2b$ (FIG. 2) in the direction parallel to the field coil axis 12. The axial length may be about 20 cm or less, and most preferably about 14 cm. The field coils are mounted around a main axis 14 so that the individual axes 12 of all of the field coils are parallel to the main axis. The field coil axes 12 are disposed on a circular locus 16 concentric with main axis 14. Thus, the field coils 10 define a generally planar array, in a plane perpendicular to the main axis 14. The radius of this locus desirably is about 50 cm or less, more preferably between about 25 cm and about 35 cm and most preferably about 31 cm. The coils are mounted within a toroidal cryostat having an inner wall 18 defining a central bore coaxial with the main axis 14 and an outer wall 20. This single cryostat encompasses all of the field coils. For clarity of illustration, the cryostat is omitted in FIG. 2. As best seen in FIG. 1, there are interstices 22 between the field coils within the cryostat. These interstices can be used, for example, to accommodate coil mountings which hold the coils in position within the cryostat. The interstices can also be used to facilitate flow of the cryogen around the field coils.

The magnet further includes a central field coil 24 disposed within the array of outer field coils 10 coils and coaxial with the main axis 14. The axial dimensions of the central main field coil 24 are equal to those of the outer main field coils 10, and the central main field coil desirably is disposed at the same axial location as the outer main field coils. Stated another way, the central main field coil is coplanar with the outer main field coils. The current in the central field coil 24 flows in the same sense as the current in outer field coils 10. For example, if the current flow in the outer field coils is clockwise around coil axes 12, the current flow in central coil 24 should be clockwise around main axis 14.

The magnet further includes an inner shim coil in the form of a solenoid coaxial with the main axis 14 and central field coil 24, the inner shim coil also being disposed inside of the array of outer field coils. An outer shim coil 28 is provided in the form of a cylindrical solenoid also coaxial with the main axis. The inner and outer shim coils have the same axial thickness $2b$ as the field coils, i.e., less than about 15 cm and desirably about 10 cm. The inner shim coil has an outer radius of about 25 cm or less, preferably about 22 cm and may have an inner radius of about 20 cm or more, desirably about 21 cm. The outer shim coil has an inner radius of about 39 cm or more. Shim coils 25 and 28 are axially aligned with the field coils 10. The shim coils and the field coils begin and end at the same location in the Z or axial direction along the main axis.

The shim coils and the central field coil may be superconducting or resistive. If the shim coils and/or central field coils are superconducting, they are disposed within the cryostat. If they are resistive, they may be physically mounted to the cryostat by means of an external frame (not shown). The magnet may also include appropriate current drivers for exciting currents in the field coils; cooling devices for maintaining the interior of the cryostat at a temperature below the superconductivity temperature of the coils and current drivers for actuating the shim coils and adjusting these currents. The magnet may also include gradient coils for selectively applying magnetic field gradients in directions transverse to the main axis (not shown), and drivers for actuating the gradient coils.

The magnet as discussed above can be part of a movable apparatus as described in the aforementioned commonly assigned applications. The apparatus desirably is associated with a radio frequency transmitter and a receiver for receiving radio frequency and magnetic resonance signals from the subject. Also, the apparatus can include therapeutic devices such as a high intensity focused ultrasound or other sonic applicator for applying energy at specific locations within the subject so as to treat the subject.

Figure 3:
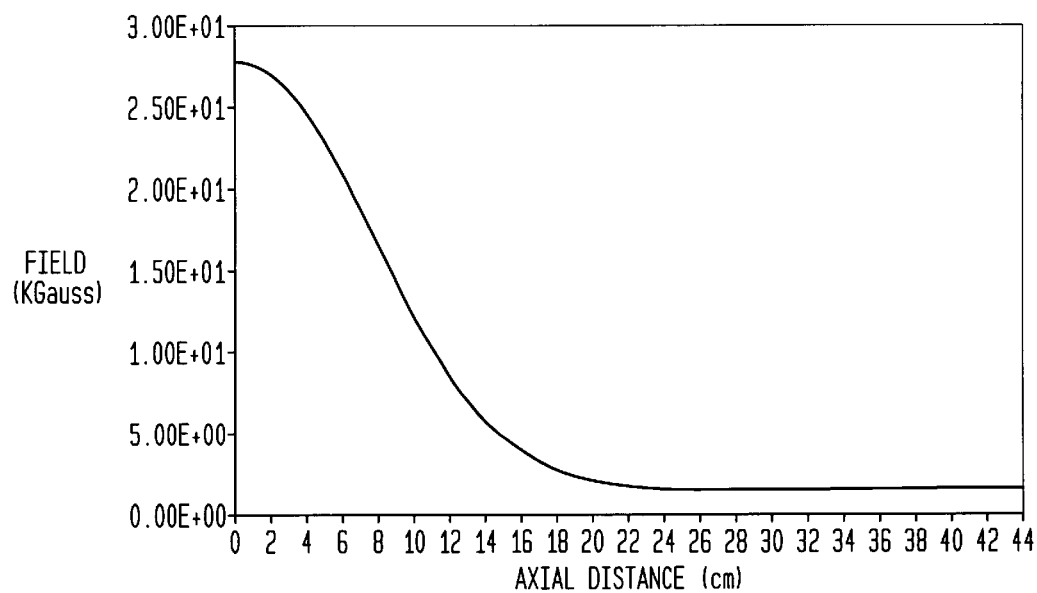
FIG. 3 is a graph of the field generated by the coils illustrated in FIGS. 1 and 2.

In operation, each of the field coils carries current at a density of about 15,000 amps/cm$^2$ of cross-sectional area, i.e., about 26,500 ampere turns. The inner and outer shim coils each carry about 1.5 million ampere turns. The current flow in the inner shim coil 25 can be either codirectional or counter directional to the flow of current in the field coils 10 and 24. The current in outer shim coil 28 also can be either codirectional or counter directional to the current in the field coils. Typically, if the current flow in one shim coil is codirectional with the current flow in the field coils, the current flow in the other shim coil is counterdirectional with the current flow in the field coils. The main field produced by main field coils is schematically depicted in FIG. 3. The field magnitude B on main axis 14 is plotted as a function of distance from the center of the magnet, i.e., distance along the axis from a point on the axis midway between the ends of the coils. The magnet provides a useful field for MRI imaging in an imaging region 32 surrounding a central point 34 disposed at an axial spacing $Z_{34}$ from the central point 30. In one example, $Z_{34}$ may be about 32 cm.

As described in the aforementioned copending applications, the magnet can be used by positioning the magnet alongside a medical patient or other subject to be imaged, so that the imaging region 32 is disposed inside the subject's body and encompasses the regions to be imaged.

Figure 4:
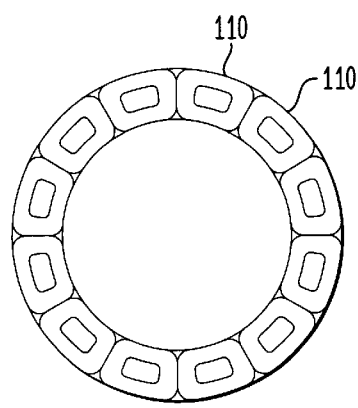
FIG. 4 is a view similar to FIG. 1 but depicting a magnet according to a further embodiment of the invention.

As mentioned above, the currents in shim coils 25 and 28 superimpose a shim field on the main field generated by main field coils 10. The resultant field has a sweet spot or minimum curvature slice within the imaging region. The sweet spot can be moved by varying the shim coil currents. numerous variations and combinations of the features discussed above can be utilized without departing from the invention. For example, more or fewer field coils may be used but most preferably about 6 to about 12 field coils are employed. Also, it is not essential that the individual field coils be round. As depicted in FIG. 4, a magnet in accordance with an alternate embodiment of the invention may include field coils having cross sectional shapes approximating a truncated sector. In still additional embodiments, the field coils may be provided as an inner set of field coils and an outer set of field coils surrounding the inner set. Also, the invention can be used with resistive field coils rather than superconducting field coils, although superconducting field coils are preferred.

What is claimed is:

1. A single-sided magnet for magnetic resonance imaging comprising a plurality of outer field coils, each said coil having a coil axis and turns extending around said coil axis, said field coils being arranged in a substantially symmetrical pattern about a main axis with said coil axes substantially parallel to said main axis, the magnet further comprising shim coils coaxial with said main axis, said shim coils including an inner shim coil concentric with said main axis and an outer shim coil concentric with said main axis.

2. A magnet as claimed in claim 1 wherein said outer field coils are substantially identical to one another.

3. A magnet as claimed in claim 1 wherein said outer field coils are superconducting coils, the magnet further comprising a unitary cryostat encompassing said outer field coils.

4. A magnet as claimed in claim 1 wherein said outer field coils are disposed in a generally planar array, the plane of said array being perpendicular to said main axis.

5. A magnet as claimed in claim 4 further comprising a central field coil coaxial with said main axis, said central field coil being disposed inside said array of outer field coils.

6. A magnet as claimed in claim 4 wherein said coil axes are arranged on a circular locus coaxial with said main axis.

7. A magnet as claimed in claim 6 wherein said outer field coils are substantially in the form of right circular cylinders.

8. A magnet as claimed in claim 6 including more than four said outer field coils.

9. A magnet as claimed in claim 8 including six to twelve said outer field coils, each in the form of a right circular cylinder having an outer radius of about 10 cm or less and a length of about 15 cm, and said circular locus has a radius of about 20 to about 40 cm.

10. A method of operating a magnet as claimed in any of the preceding claims comprising the step of actuating said field coils with currents so that currents flow around the axes of all of said field coils in the same sense.

11. A method as claimed in claim 10 wherein said field coils carry equal numbers of ampere-turns.

12. A method as claimed in claim 10 wherein said field coils cooperatively provide a main field having a sweet spot disposed on said main axis forward of said main field coils, the magnitude of said field being non-zero and the radial field curvature of said field being at a local minimum at said sweet spot.

13. A method as claimed in claim 12 wherein the magnitude of said field is at least about 500 gauss and the radial field curvature of said main field is less than about 500 parts per million over a 4 cm radius at said sweet spot.

14. A method as claimed in claim 13 wherein said main field is substantially symmetrical about said main axis at said sweet spot.

15. A method as claimed in claim 14 further comprising the step of actuating said shim coils concentric with said main axis so as to superimpose a shim field on said main field.

16. A method as claimed in claim 15 further comprising the step of adjusting said shim field to shift the sweet spot along the axis.

* * * * *

UNITED STATES PATENT AND TRADEMARK OFFICE
CERTIFICATE OF CORRECTION

PATENT NO. : 6,278,351 B1
DATED : August 21, 2001
INVENTOR(S) : Roger W. Wheatley Page 1 of 1

It is certified that error appears in the above-identified patent and that said Letters Patent is hereby corrected as shown below:

Column 3,
Line 61, "Vost" should read -- Most --.

Column 5,
Line 48, "coils is" should read -- coils 10 is --.
Line 51, "coil in" should read -- coil 25 in --.

Column 6,
Line 29, "counter directional" should read -- counterdirectional --.
Line 37, "point on" should read -- point 30 on --.
Line 52, "numerous" should read -- Numerous --.

Signed and Sealed this

Twelfth Day of March, 2002

Attest:

Attesting Officer

JAMES E. ROGAN
Director of the United States Patent and Trademark Office